United States Patent
Morris et al.

(10) Patent No.: US 10,491,302 B1
(45) Date of Patent: Nov. 26, 2019

(54) RACK-LEVEL PHOTONIC SOLUTION

(71) Applicant: HEWLETT PACKARD ENTERPRISE DEVELOPMENT LP, Houston, TX (US)

(72) Inventors: Terrel Morris, Garland, GA (US); Daniel Alan Berkram, Loveland, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 16/055,962

(22) Filed: Aug. 6, 2018

(51) Int. Cl.
| | |
|---|---|
| H04J 14/00 | (2006.01) |
| H04B 10/40 | (2013.01) |
| H04J 14/02 | (2006.01) |
| G02B 6/42 | (2006.01) |
| H04Q 11/00 | (2006.01) |

(52) U.S. Cl.
CPC ........... H04B 10/40 (2013.01); G02B 6/4261 (2013.01); H04J 14/02 (2013.01); H04Q 11/0003 (2013.01); H04Q 11/0062 (2013.01)

(58) Field of Classification Search
CPC ..... H04B 10/40; H04J 14/02; H04Q 11/0066; H04Q 11/0067; H04Q 11/0062; H04Q 11/0003; H04Q 11/0005; G02B 6/4246; G02B 6/3546
USPC ........ 398/45, 46, 47, 48, 49, 50, 51, 53, 56, 398/57, 79, 135, 136, 138, 139, 164, 158, 398/159, 3, 5; 385/24, 16, 17, 18; 709/250, 223
See application file for complete search history.

(56) References Cited

U.S. PATENT DOCUMENTS

| | | | |
|---|---|---|---|
| 6,796,716 B1 | 9/2004 | Handforth et al. | |
| 8,200,097 B2 | 6/2012 | Cole | |
| 8,315,057 B2 | 11/2012 | Xu et al. | |
| 8,358,934 B2 | 1/2013 | Hinderthuer et al. | |
| 8,503,879 B2 * | 8/2013 | Xu ..................... | H04Q 11/0005 398/45 |
| 9,055,119 B2 | 7/2015 | Baker | |
| 9,391,706 B2 | 7/2016 | Lewis et al. | |
| 9,553,689 B2 | 1/2017 | Kato et al. | |
| 9,585,032 B2 | 2/2017 | Thyni | |
| 9,894,427 B2 * | 2/2018 | Sindhu ............... | H04Q 11/0066 |
| 9,965,433 B2 | 5/2018 | Tomada | |
| 2004/0195944 A1 | 10/2004 | Sugihara | |
| 2005/0282413 A1 | 12/2005 | Israel et al. | |

(Continued)

OTHER PUBLICATIONS

Farrington, N.; "Helios: a Hybrid Electrical/optical Switch Architecture for Modular Data Centers"; Jan. 2011; 10 pages.

(Continued)

*Primary Examiner* — Hanh Phan
(74) *Attorney, Agent, or Firm* — Nolte Intellectual Property Law Group (57) ABSTRACT

A server-to-switch interconnection system that includes a plurality of server modules each having wired server network connection ports, the plurality of server modules being positioned in a server rack. The switch system also includes a rack-level server photonic module that has a plurality of wired network connection ports connecting to a plurality of servers from a single photonic module, an optical transceiver in communication with the wired network connection ports, and an optical port in communication with the optical transceiver.

17 Claims, 10 Drawing Sheets

(56) References Cited

U.S. PATENT DOCUMENTS

| | | | |
|---|---|---|---|
| 2012/0008945 A1* | 1/2012 | Singla | H04J 14/0204 |
| | | | 398/49 |
| 2014/0169499 A1* | 6/2014 | Riani | H04L 27/34 |
| | | | 375/298 |
| 2014/0205243 A1 | 7/2014 | Baker | |
| 2015/0086214 A1 | 3/2015 | Lewis et al. | |
| 2015/0237421 A1 | 8/2015 | Morgan et al. | |
| 2016/0091685 A1 | 3/2016 | Raza et al. | |
| 2016/0342563 A1 | 11/2016 | Tomada | |
| 2017/0134836 A1 | 5/2017 | Sindhu et al. | |
| 2018/0027313 A1* | 1/2018 | Adiletta | H03M 7/40 |
| | | | 398/45 |
| 2018/0191115 A1 | 7/2018 | Khazen et al. | |
| 2018/0375577 A1 | 12/2018 | Leigh et al. | |

OTHER PUBLICATIONS

Lugones, D., et al; "A Reconfigurable Optical/Electrical Interconnect Architecture for Large-scale Clusters and Datacenters"; May 15-17, 2012; 10 pages.
Yan, F., et al.; "HiFOST: a scalable and low-latency hybrid data center network architecture based on flow-controlled fast optical switches"; Jul. 13, 2018; 3 pages.
Finisar Demonstrates New 400G, 200G and 1000 Pluggabie Optical Modules and Introduces Flexgrid® Single Low Profile Wavelength Selective Switch at OFC 2017, Mar. 21, 2017, http://investor.finisar.com/news-releases/news-release-details/finisar-demonstrates-new-400g-200g-and-100a-pluggable-optical>.

\* cited by examiner

RACK-LEVEL PHOTONIC SOLUTION

BACKGROUND

As numbers of computers, particularly servers, are deployed in large-scale or hyper-scale data center applications, the need to connect those computers to one another at massive scale as well as connecting them to the outside world has driven change in data center networking topologies and strategies. Two of the primary drivers of cost and performance in these large networks are the network topology and the photonic interconnections between them. The trend has been to utilize many low-cost low-radix switches connected to other low-radix switches via multiple copper and optical connections. As the networks increase efficiency by increasing data rate, the distances that data signals can traverse in copper cables diminishes as a result of signal integrity loss in the copper medium. Therefore, the ratio of copper to optical cables has trended in favor of optical cables, as the signal traverse distance for optical cables is significantly longer.

The fundamental problem with optical cables is cost. Present optical solutions, which are cost-effective solutions when used to traverse long distances, become inefficient when used to traverse shorter distances. As a result, cost-reduction exercises have developed high-channel-count solutions that amortize the cost of cable attachment and packaging across a larger number of connections. Where current solutions may use optical engines with 4 channels or perhaps 8 channels, these high-density solutions favor 24-36 channels.

The remaining problem is the classical last-mile problem, or in this case, a last-meter problem. Taking 24-channel or 36-channel cables directly to computer servers is not efficient due to over-provisioning. Likewise, taking 4-channel solutions to many servers is not efficient due to duplicative packaging costs. As more networks seek to use high-radix switches in order to remove layers from the network hierarchy, they are challenged by the costs of the final layer connection to the servers. Since the connection between a high-radix middle-of-row switch and a large array of servers requires making many connections, and the array of servers are typically in different equipment racks, the problem of requiring the distance capabilities of optical connections is conflated with the problem of requiring low-cost connections to many servers.

Therefore, there is a need to minimize wired copper connections to servers to allow for longer data transmission lengths provided by fiber optical connections, while also minimizing costly optical fiber connections. Further, legacy servers' output electrical signals and it is desirable to provide a cost-effective system that continues to provide the ability to use legacy server equipment.

BRIEF DESCRIPTION OF THE DRAWINGS

So that the manner in which the recited features, advantages and objects of the present disclosure may be understood in detail, a more particular description of the invention, briefly summarized above, may be had by reference to the examples thereof which are illustrated in the appended drawings. It is to be noted, however, that the appended drawings illustrate only typical examples of this invention and are therefore not to be considered limiting of its scope, for the invention may admit to other equally effective examples.

DETAILED DESCRIPTION

In the following, reference is made to examples of the inventive concept of this disclosure. However, it should be understood that the inventive concept is not limited to described examples. Instead, any combination of the following features, elements, or functionalities, whether related to different examples or not, is contemplated by the inventors as a possible combination that may be used to implement and practice an aspect of the present innovation. Furthermore, in various examples the innovation of this disclosure provides numerous advantages over the prior art, and although the examples of the present innovation may achieve advantages over other possible solutions and/or over the prior art, whether or not a particular advantage is achieved by a given example is also not intended to be limiting on the scope of the present disclosure. Therefore, the following aspects, features, functionalities, examples, and advantages are intended to be merely illustrative and are not considered elements or limitations of the appended claims, except where explicitly recited in a claim. Similarly, reference to "the invention" or "the innovation" are not to be construed as a generalization of any inventive subject matter disclosed herein and shall not be considered to be an element or limitation of the appended claims except where explicitly recited in a claim.

Example embodiments of the present disclosure provide a rack-level solution using CWDM photonic modules to reduce photonic fiber requirements by a factor of four (four colors per fiber with CWDM). Example embodiments of the disclosure provide mechanical, electrical, power, and cooling solutions in a single rack-level infrastructure that also allows hot-swap of the photonic modules.

Figure 1:
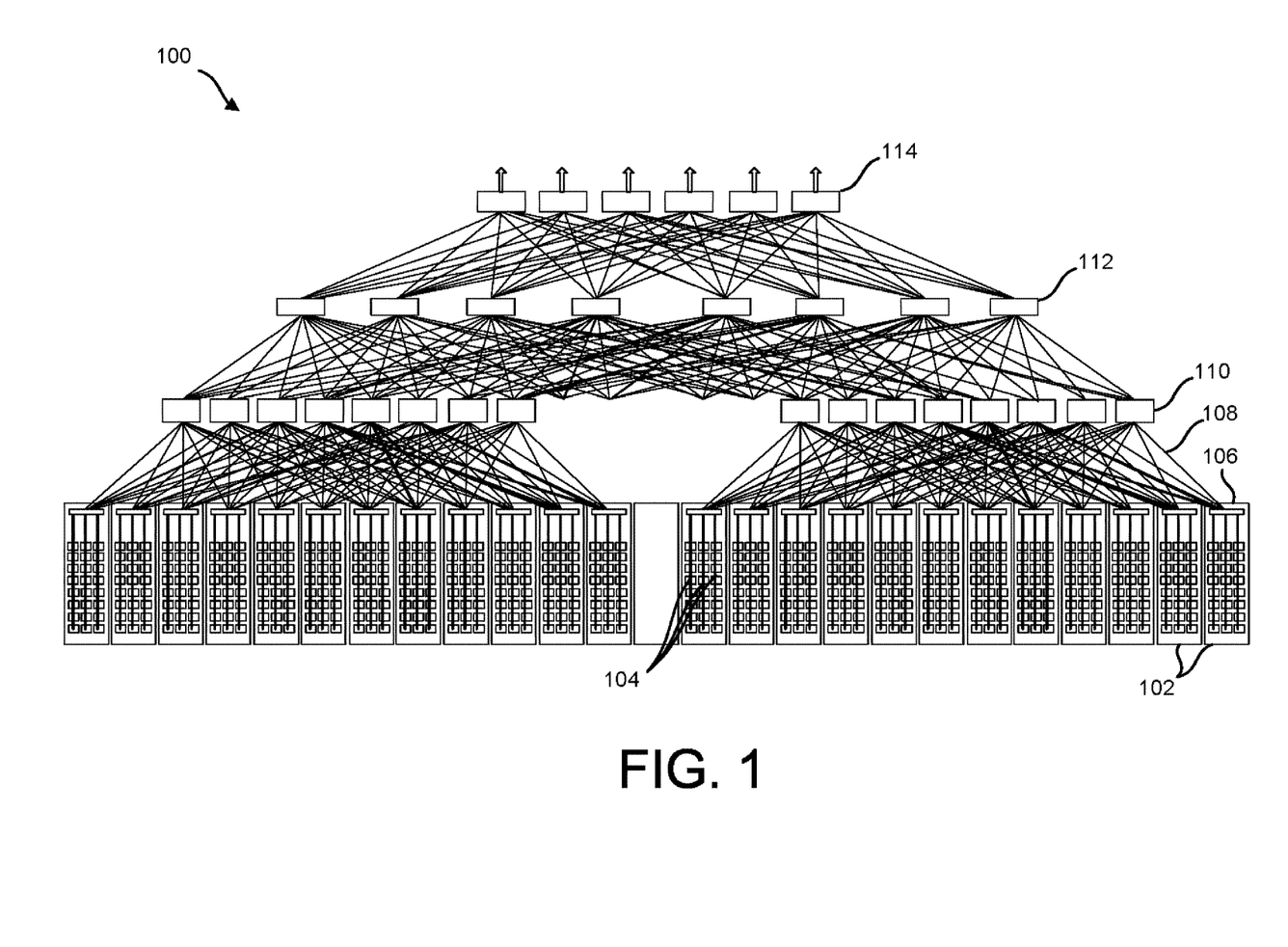
FIG. 1 illustrates an example hyper-scale architecture.

FIG. 1 illustrates an example hyper-scale architecture 100 having a plurality of server racks 102 each containing a plurality of servers 104 therein. Each of the individual servers 104 are electrically connected to a top of rack (TOR) switch 106, and the TOR switches 106 are optically connected to middle of row (MOR) switches 110 through photonic connections 108. The MOR switches 110 are connected (typically photonically) to leaf switches 112 that are connected (typically photonically) to spine switches 114, which in turn may connect to core switches. One challenge with hyper scale data centers is that they are typically housed in in buildings that are kilometers in size, thus resulting in many of the connections in the hyper-scale architecture 100 being tens or hundreds of meters long. These distances present significant challenges for signal propagation, as signals degrade as they traverse the line. Further, as the signal speeds increase, the signal degradation increases, as faster signals aren't able to traverse as long of a line run as slower signals. For example, at ten gigabit data transmission speeds the signal can easily propagate through about 10 meters copper line connection before degradation starts diminishing the usable signal quality (depending upon the cable materials and construction chosen. At twenty-five gigabit data transmission speeds the signal can barely propagate three meters of copper successfully, unless special materials are used, and at fifty gigabit the signal transmission length in copper is between one meter and two meters, depending on the cable materials and construction, as well as the electronic drivers and receivers employed on either end of the cable.

Figure 2:
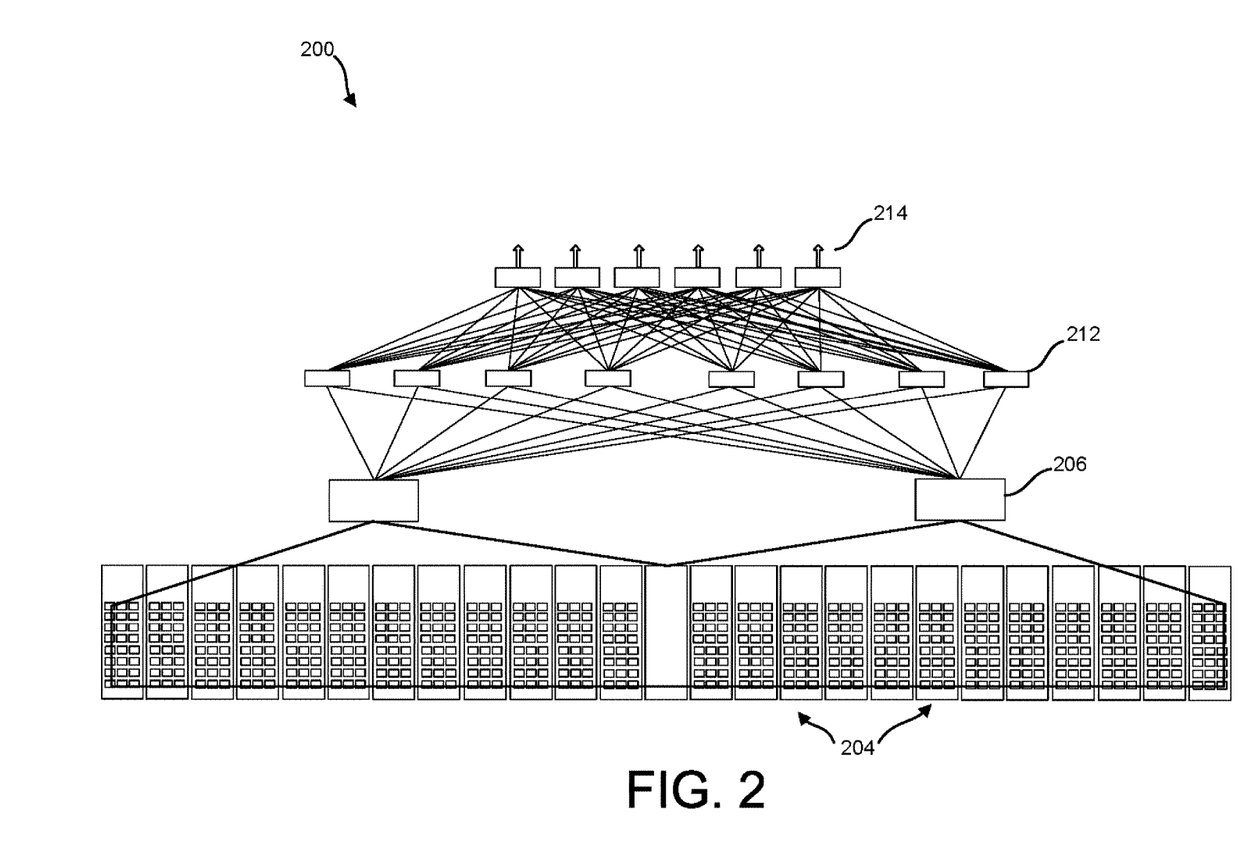
FIG. 2 illustrates an example improved hyper-scale architecture.

FIG. 2 illustrates an example improved hyper-scale architecture 200 where the servers 204 are connected directly to the middle of row (MOR) switches 206, which then again connect to the leaf switches 212 and the core switches 214. In this example architecture the majority of the switching has been translated into the redundant high radix MOR switches that connect directly to the servers 204. However, the physical size of the network presents connection issues, as this configuration requires the connections to span approximately fifteen meters to connect the various components, which is challenging to accomplish with copper connections and not cost effective to do with photonic connections due to the sheer number of connections required, which in the example hyper scale architecture 200, would require 1,152 connections (576 primary connections and 576 backup/redundant connections to connect the 576 racked servers).

Figure 3:
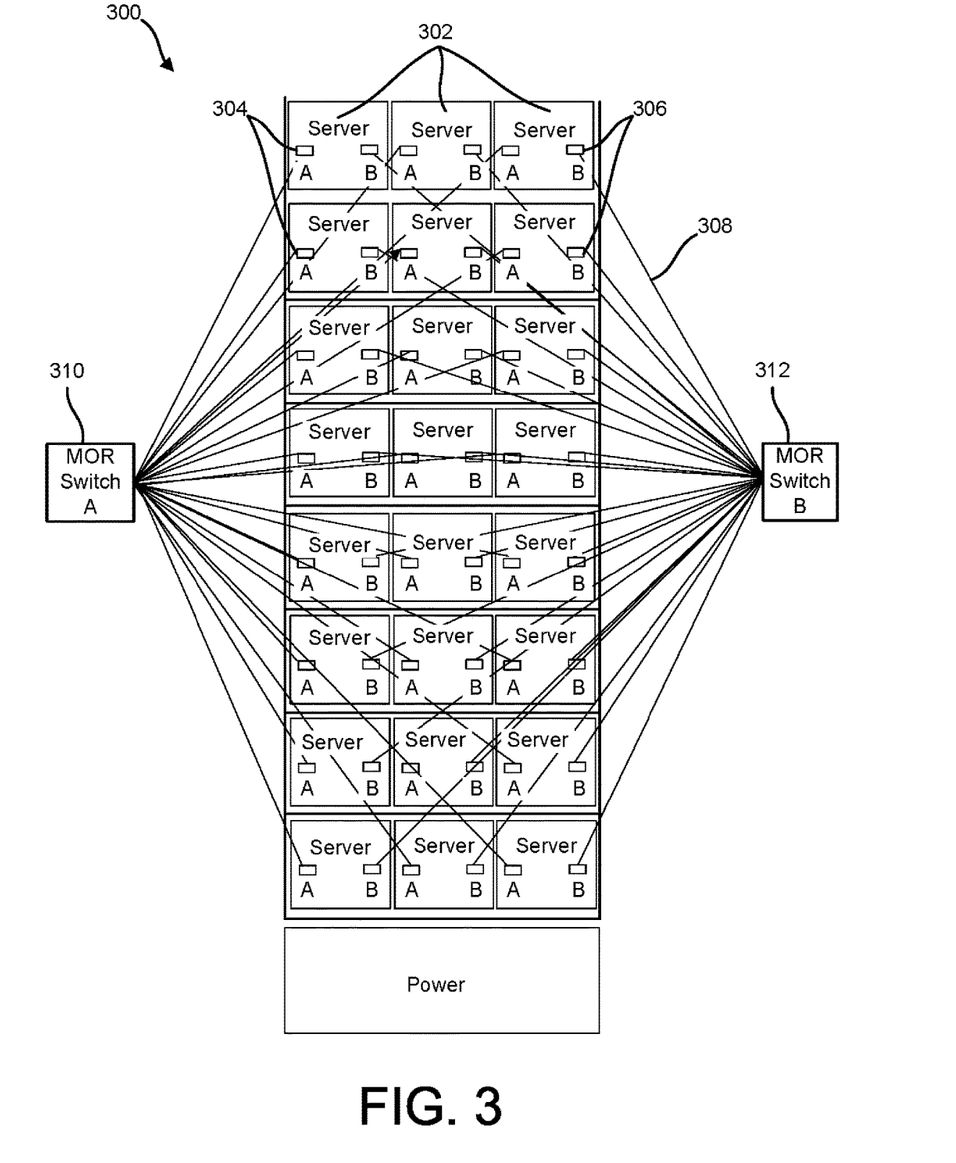
FIG. 3 illustrates an example rack-level example architecture schematic using active optical cable connections.

FIG. 3 illustrates an example rack-level architecture schematic 300 using active optical cable connections to reduce the number of required electrical connections. The servers 302 each have a primary or A port 304 and a secondary or B port 306. Each A port 304 is connected to a MOR switch 310 and each B port 306 is connected to a MOR switch 312. The connections to the MOR switches 310, 312 are through active optical cables 308, which may have quad small form-factor pluggable (QFSP) type hot pluggable transceivers on the terminating ends that connect to the servers 302 or the MOR switches 310, 312. This configuration requires an active optical cable 308 to connect between to each server A port 304 and the corresponding MOR switch A 310 and each server B port 306 and the corresponding MOR switch B 312. Therefore, in the example configuration shown there would be 48 active optical cables 48 used to connect to 24 servers 302 each having an A port 304 and a B port 306.

Figure 4:
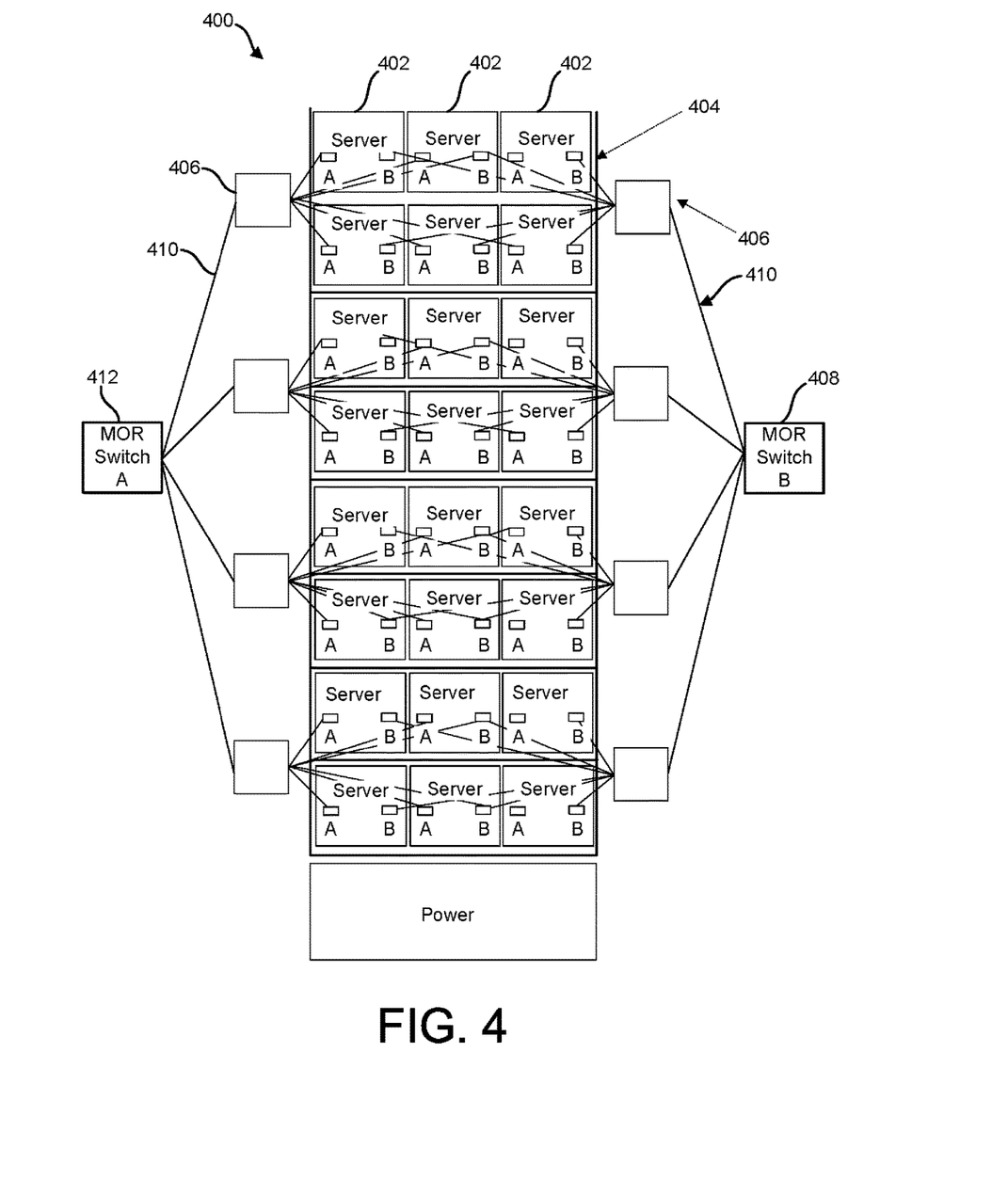
FIG. 4 illustrates an example rack-level module schematic using a combination of copper and photonics connections.

FIG. 4 illustrates an example rack-level module schematic using a combination of copper and photonics connections to facilitate fully-redundant server connectivity. In this example, the failure of a single MOR switch or the failure of a single module 406 would not loss of connectivity to any servers. The example rack level module schematic 400 includes servers 402 again having A and B QFSP ports that are connected by copper connections 404, to photonics modules 406. The photonics modules 406 are then optically connected to the MOR switches 408, 412 through optical or photonic cables 410. The optical cables used in this example can be used to connect to optical modules 406 via CWDM techniques, reducing the number of required fibers by a factor of 4. The example optical modules 406 provide 24 electrical channels per optical cable, and are thus able to supply 6 servers with 4-channel connections, consistent with Quad Small Form-factor Pluggable (QSFP) connectivity.

Since a typical server rack is one to two feet wide and in the present example the photonics modules 406 may be rack-level components, the longest copper cable connection length will be less than two feet long, thus accommodating high speed gigabit signals, over 50 gigabits, for example, without significant degradation. The connection from the photonics modules 406 to the MOR switches 408, 410 may be individual optical cables having, for example, 24 channels per cable. The photonics module 406 may be a coarse wavelength division multiplexer (CWDM) module configured to convert the electrical signals received from the servers 402 on the copper wires 404 to optical signals that can be transmitted on the photonic cable 410 to the MOR switches 408, 412. The photonics module 406 may provide connections to six QSFP ports, for example, through a single photonic cable 401. The photonic cable 410 may be a twelve wide parallel fiber optical ribbon cable typically used with four colors of light to support signal transmission. The twelve fibers allow, as an example, for six send and six receive fibers to be used, and with each fiber having the ability to carry four distinct optical signal colors, the twelve wide fiber cable provides a total of 24 channels (6 fibers and 4 colors per direction). The twelve-fiber optical cable 410 provides 24 electrical channels to be carried across it in optical signals, and as such, the photonic module 406 can package send and receive signals from 6 QFSP ports on the servers 402 for transmission across the single 12 wide optical fiber to the MOR switch 408, 412. Although example configurations herein use a twelve wide optical fiber ribbon cable, the inventive concepts are not limited to any particular size, width, or type of optical fiber or connection, as the configurations scale up or down easily.

The photonics module 406 may be positioned rack level, i.e., the photonics module may be built integral to the server rack and therefore positioned next to, adjacent, or near the servers 402 by being built directly into the server rack that physically supports servers 402, or in a sub-chassis that attaches to the vertical rack rail. This rack level positioning of the optics module 406 allows for simplification of the server QSFP port wiring, as specific wire lengths may be used for each server port. For example, the wire length for the connection to server 1 may be shorter than the wire length for the connection to server 2, thus indicating to a server technician that the wires for server 1 cannot be plugged into any other server by mistake. This length designated wire configuration allows for reduced wiring errors and facilitates efficient and proper connection of server ports to the optical modules 406. Further, the configuration of the current example allows for legacy server technology and configurations to be unchanged, as the send/receive QSFP ports on the servers remain unchanged, thus allowing legacy servers with electrical connections to readily connect to the rack-level optical modules 406 of the present example, thus avoiding the costly process of upgrading to optical or photonic servers.

Figure 5:
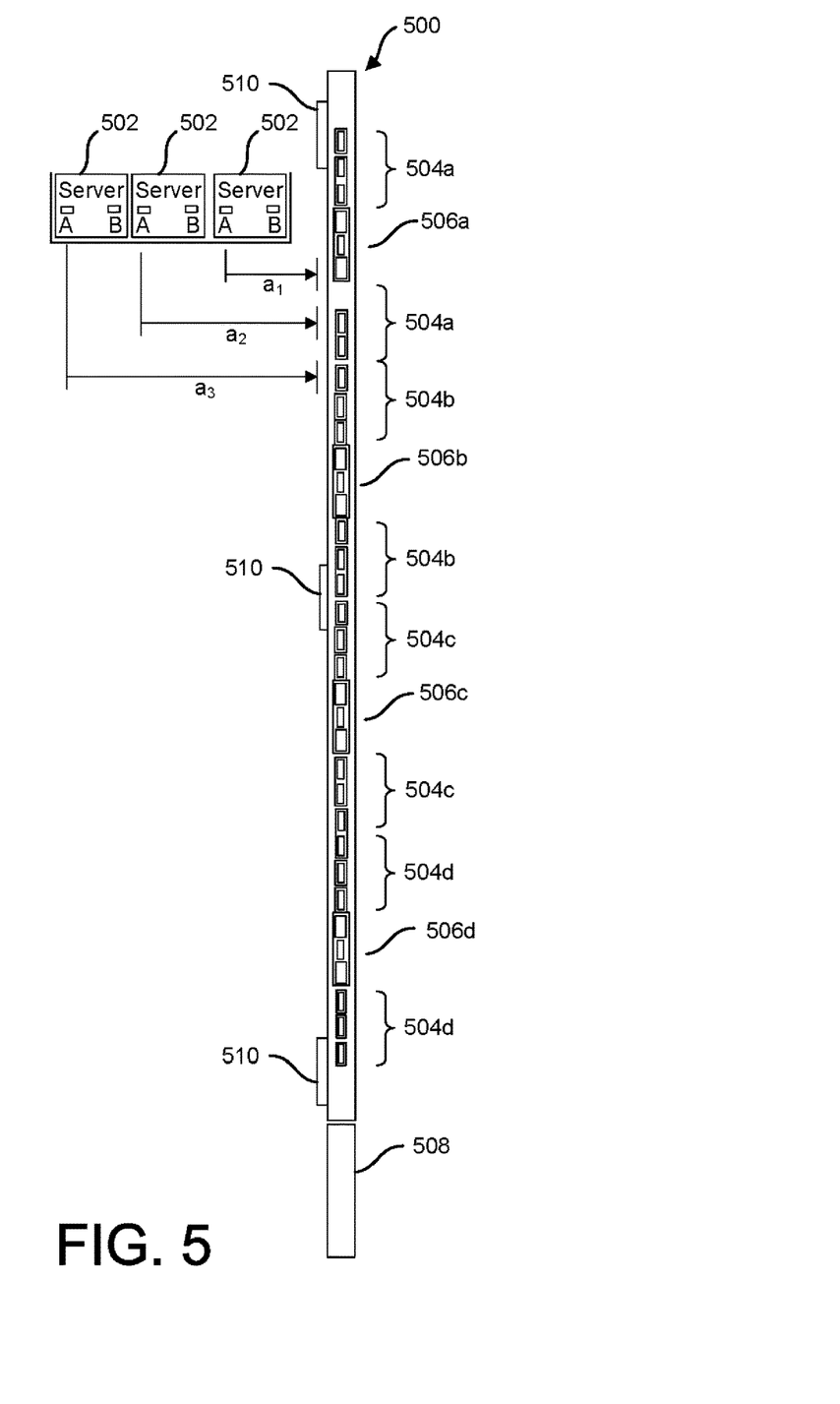
FIG. 5 illustrates an example vertical rack-level module implementation such as would be deployed on rack rails on either side of the servers.

FIG. 5 illustrates an example vertical rack-level module implementation. The vertical rack-level module 500 may be sized and shaped to be built integrally with a server rack that supports a plurality of servers or server components. More particularly, the module 500 may be sized to be integrally positioned between the upright support rails or posts of a server rack on the left and right sides of the server rack, and specifically, an individual module 500 may be positioned on a side of a server rack between a front post and a rear post, but generally positioned near the front rack post with plug, terminals, connections proximate corresponding plugs on the server components. The module 500 may include a plurality of QSFP or QSFP-DD ports 504a ... 504n, a plurality of optical modules 506a ... 506n, an integrated power supply 508, and one or more cooling fans 510 all integrally formed therein. The module 500 may generally extend vertically along a side of a server rack and have the ports 504 and the optical modules 506 positioned to be connected with rows of servers.

In the present example implementation, the first or top set of ports 504a may be configured to connect with the A port of each of the servers 502 in the top or adjacent row of the server rack. As discussed above, the wired connections between the QSFP ports 504 and the server A ports may be of specific lengths to prevent misconnections. For example, a wired connection from QFSP port 504a may be of a specific length that traverses distance a1, but that is not capable of reaching another server port that is a distance a2 away from the QFSP ports 504a. Therefore, in order to simplify wiring of the servers and reduce misconnections, the wired connections from QSFP ports 504a may be three specific lengths, approximately a1, a2, and a3. This eases connection of the servers 502, as the shortest wire of length a1 gets connected to the closest server 502 A port, the middle length wire of length a2 gets connected to the middle server 502 A port, and the longest wire of length a3 gets connected to the left or farthest server 502 A port. The QFSP ports 504a are in communication with the optical module 506a which converts the electrical signals received from the server 502 into optical signals that are output from the optical module 506a and communicated to an MOR switch (not shown). The reverse path is followed for data traveling from an MOR switch to the servers 502, as the optical signals are received by the optical module through an optical fiber and are converted to electrical signals within module 506a that are communicated to the QSFP ports 504 and then through wired connections to the server 502 ports. The server 502 B ports may be connected to a mirror module 500 positioned on the left side of the server rack in the same fashion and set up to connect to the B ports of the server 502. Further, additional rows of servers 502 (not shown) may be connected to the QSFP ports 504b ... 504n and optical modules 506b ... 506n.

The example vertical rack-level module 500 implementation provides a rack-scale solution that sits on or in a rack rail of a server rack. There may be enclosure or unit on each side, left and right, for example, of a server rack. The enclosure 500 includes an integral power supply 508 to power active components of the enclosure 500 and exhaust/cooling fans 510. The enclosure 500 includes wired 504 and optical 506 connections and transceivers to convert signals between the optical and electrical connections. The example solution provides 24 QSFP/QSFP-DD connections capable of, for example, 100G/200G operation. This example configuration requires only eight optical or photonic cables per rack, which is significantly less than the 48 optical cables required in the configuration shown in FIG. 3. Finally, the implementation of fixed cable lengths reduces cable routing and complexity and enhances serviceability.

Figure 6:
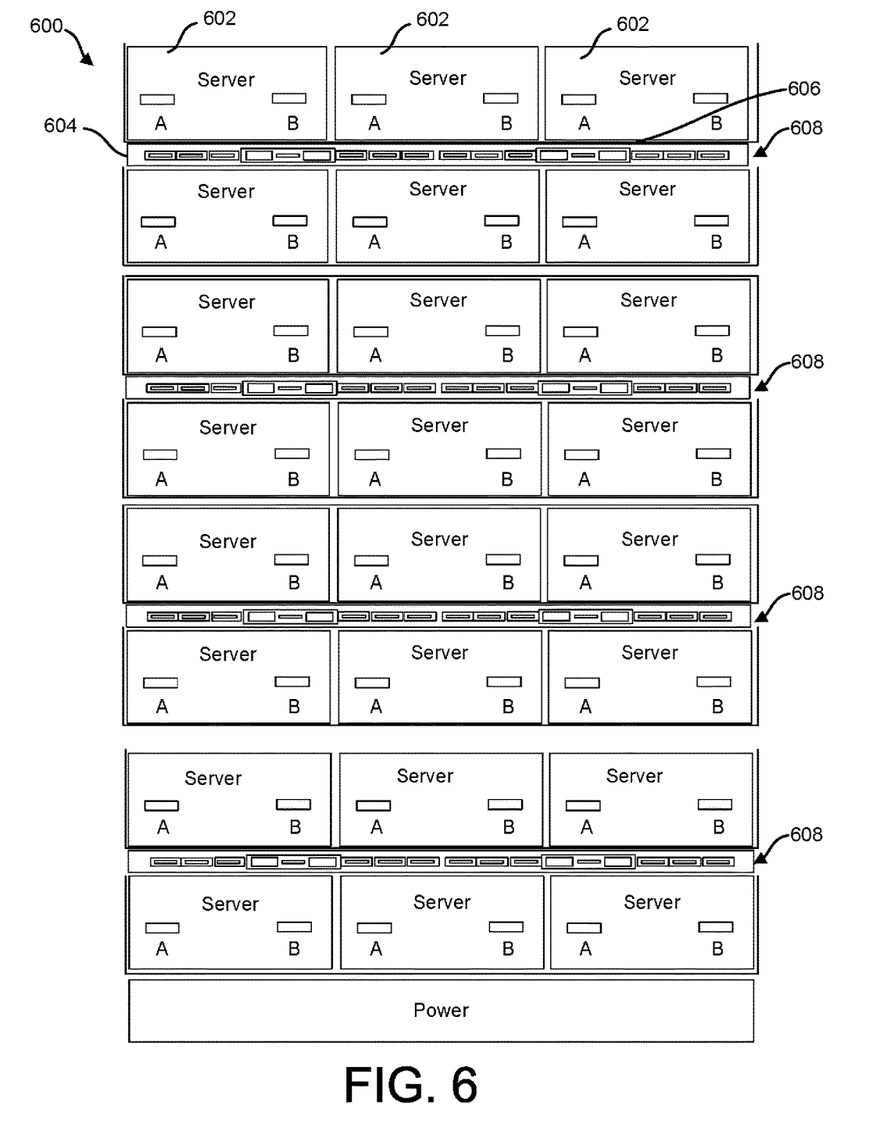
FIG. 6 illustrates an example horizontal rack-level stacked module physical implementation.

FIG. 6 illustrates an example horizontal rack-level stacked Enclosure physical implementation. The server rack 600 includes a plurality of rows of servers 602 stacked in a rack configuration with horizontal rack-level modules 608 positioned between the server 602 rows to provide electrical and optical connection thereto. The rack level enclosures 608 may be positioned in a server drawer or bay location or may be interstitially positioned in the rack between two vertically spaced server drawers, where each drawer contains a row of servers 602. The horizontal rack enclosure 608 includes QSFP ports 604 and an optical or photonic module 606 operation in similar fashion to that described in the example configuration of FIG. 5. It should be noted that in this configuration, enclosure 608 can be cooled with traditional switch or server fans housed within the enclosure, and that the units can be powered by several standard rack-level power solutions including, but not limited to, pluggable rack power schemes, corded rack power schemes, and AC power schemes. It should also be noted that the optical module 606 can be hot-swapped from the enclosure 608 without requiring the removal or opening of enclosure 608 or the removal of any servers or server connection cables.

Figure 7:
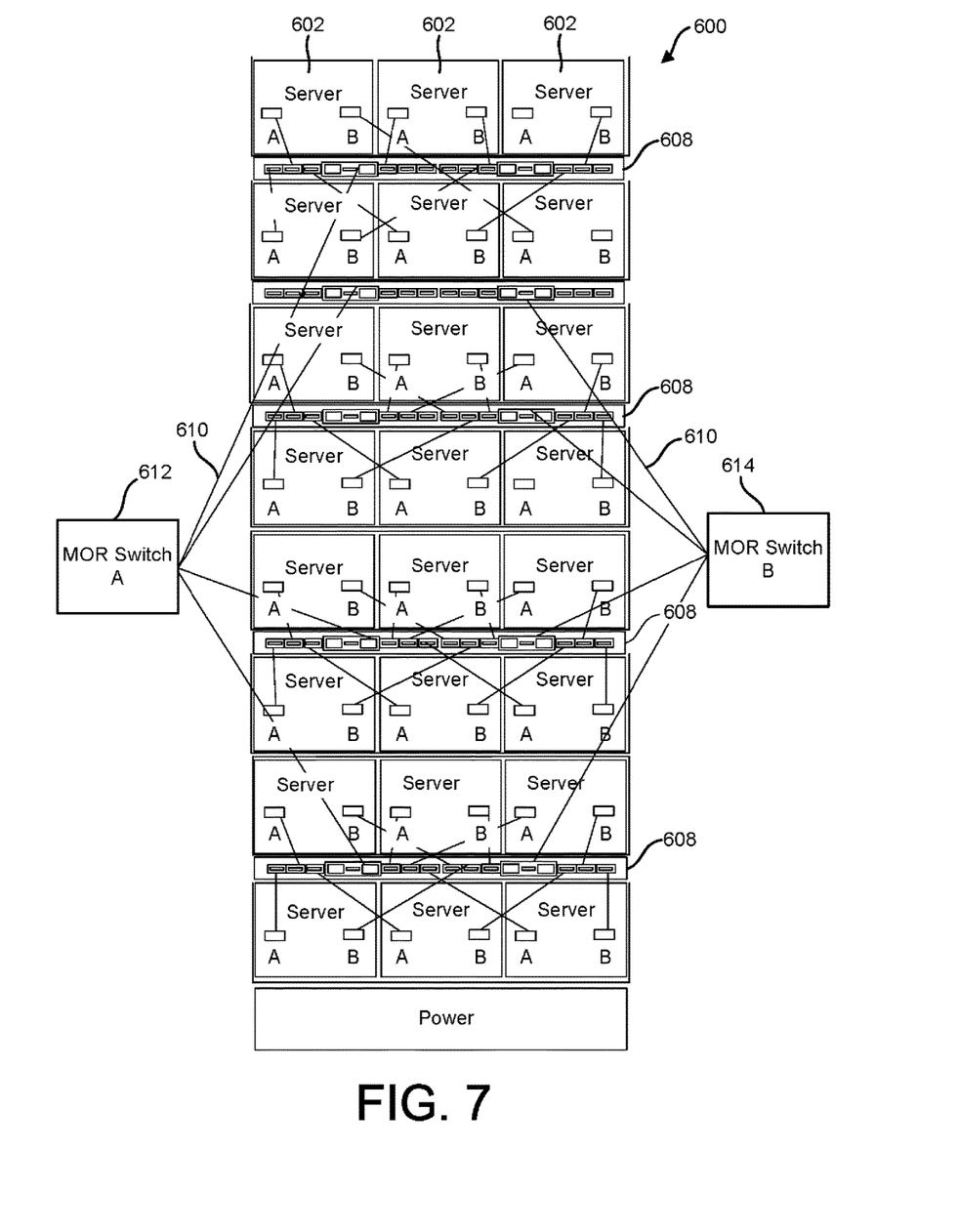
FIG. 7 illustrates an example connection schematic for a horizontal rack-level stacked module implementation.

FIG. 7 illustrates an example connection schematic for the horizontal rack-level stacked module implementation shown in FIG. 6. In this schematic the six QSFP ports 604 on the left side or left half of the rack level enclosures 608 are in wired connection to the A ports of each of the individual servers 602. The QSFP ports 604 communicate the electrical signals to the photonic module 606 on the left side of the rack. The photonic module 606 converts the electric signals to optical signals and transmits the optical signals on a multi-fiber communication medium 610 to a MOR switch 612. Similarly, the six QSFP ports 604 on the right side or right half of the rack level modules 608 are in wired connection to the B ports of each of the individual switches 602. The QSFP ports 604 communicate the electrical signals to the photonic module 606 on the right side of the rack. The photonic module 606 converts the electric signals to optical signals and transmits the optical signals on a multi-fiber communication medium 610 to a MOR switch 614. The MOR switch 614 may be in optical communication with a plurality of rack level enclosures 608 through a plurality of individual optical fiber cables, of which four are shown in the example configuration of FIG. 7. Therefore, the MOR switch A 612 routes traffic to/from the A ports on the servers 602 while the MOR switch B 614 routes traffic to/from the B ports on the servers 602. The result of this example configuration is that the copper connections between the server A or B ports and the corresponding QSFP ports 604 are very short, typically less than 0.5 meters, thus facilitating higher gigabit transmission speeds.

Figure 8:
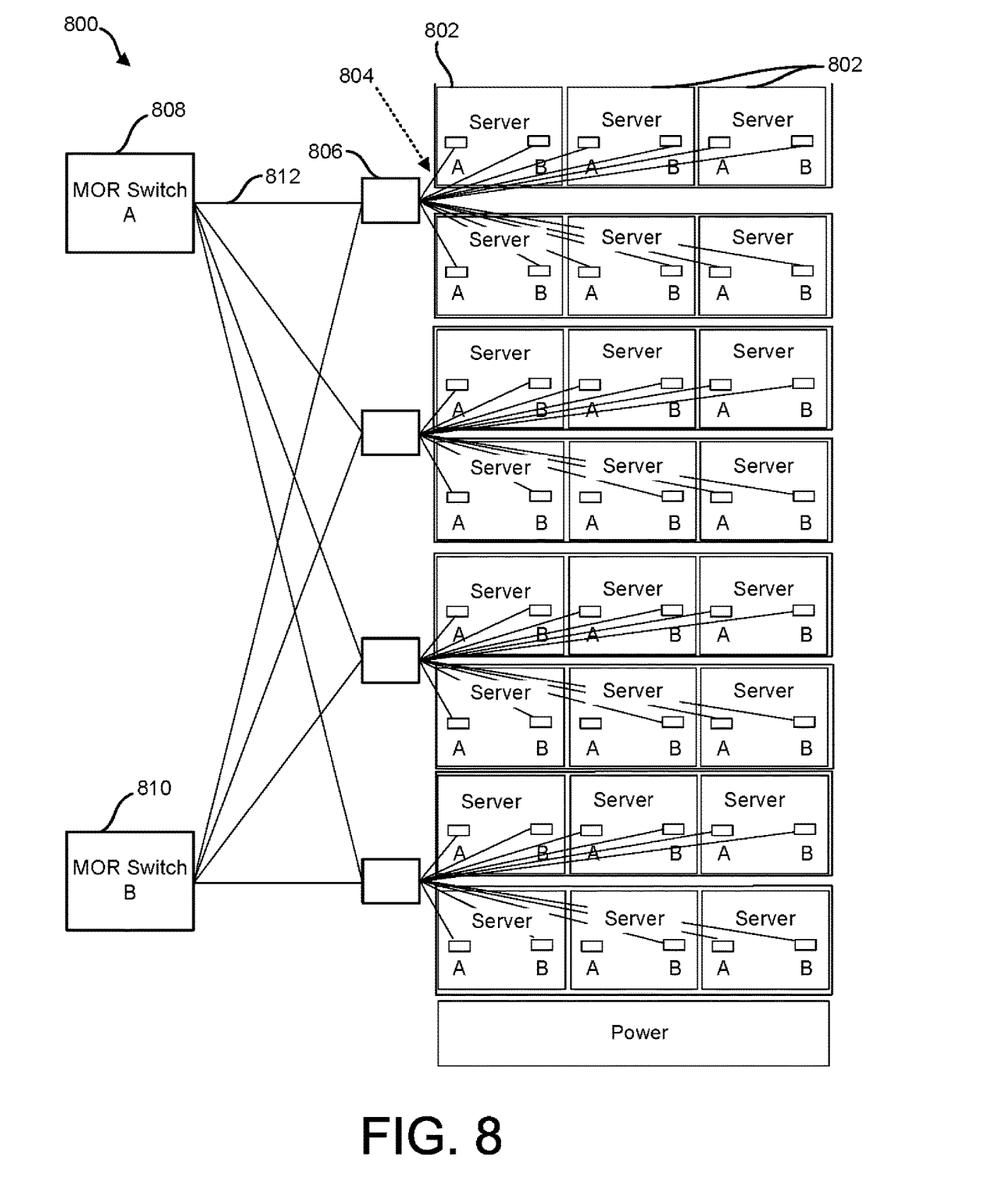
FIG. 8 illustrates an example partially-redundant rack-level schematic requiring fewer optical modules.

FIG. 8 illustrates an example rack-level schematic 800 showing a plurality of servers 802 having A and B ports, where each A and B ports of the servers 802 are in electrical communication with an optical or photonic module 806 via wired connectors 804. The optical modules 806 are in optical communication with MOR switches 808, 810 by an optical or photonic fiber connection cable 812. The example schematic 800 provides a 24-channel CWDM photonic module with connections to twelve QSFP ports through two photonic cables. Two-lane connections are utilized for each server port and both A and B ports are supplied by the same photonic module. This configuration requires only eight individual six fiber photonic cables, where three fibers in the cable are sending and 3 fibers are receiving, and each fiber carries four colors for a total of twelve channels per fiber cable per direction. Therefore, in addition to the fully-redundant cases using either the horizontal or vertical module housing solutions noted above in FIGS. 5-7 that require 8 modules for 24 servers, a semi-redundant solution is provided by the example schematic of FIG. 8, as two electrical channels (as opposed to the customary four electrical channels) are provided to each server port at the server-end electrical port connections. As such, only four photonic modules are used to connect 24 servers 602 to the MOR switches 808, 810. In this partially-redundant case, both the A and B ports of each server are connected to the same photonic module with two electrical channels for each connection. As such, the connections from the MOR switches 808, 810 are fully redundant so that if one MOR switch 808, 810 fails, all servers will have an alternative path through the second MOR switch 808, 810. If it were not redundant, the failure of the A or B switch would disrupt connectivity to all 24 servers. The connections from the photonic module to the servers are not redundant, so if a module fails, connectivity will be lost to six servers, but not to all 24 servers.

The photonic cables 812 are different for the example schematic 800, as each module must connect to MOR switch A 808 and MOR switch B 810. Therefore, the fiber and channel assignments are arranged accordingly, with three of the six "send" fibers connecting to MOR switch A 808 and three of the six "send" fibers connecting to MOR switch B 810. Similarly, three of the six "receive" fibers are connected to MOR switch A 808 and three of the six "receive" fibers connecting to MOR switch B 810. Since each fiber carries four channels by means of CWDM techniques, twelve channels are provided by three fibers. Note that these connections may be constructed with either a custom cable harness or by means of a module having two discrete photonic connections, allowing the module capability to be split between MOR switch A 808 and MOR switch B 810. Likewise, at the MOR end, two connectors would allow the same module to connect to 12 servers. i.e., 4 shelves of 3 servers each.

Figure 9:
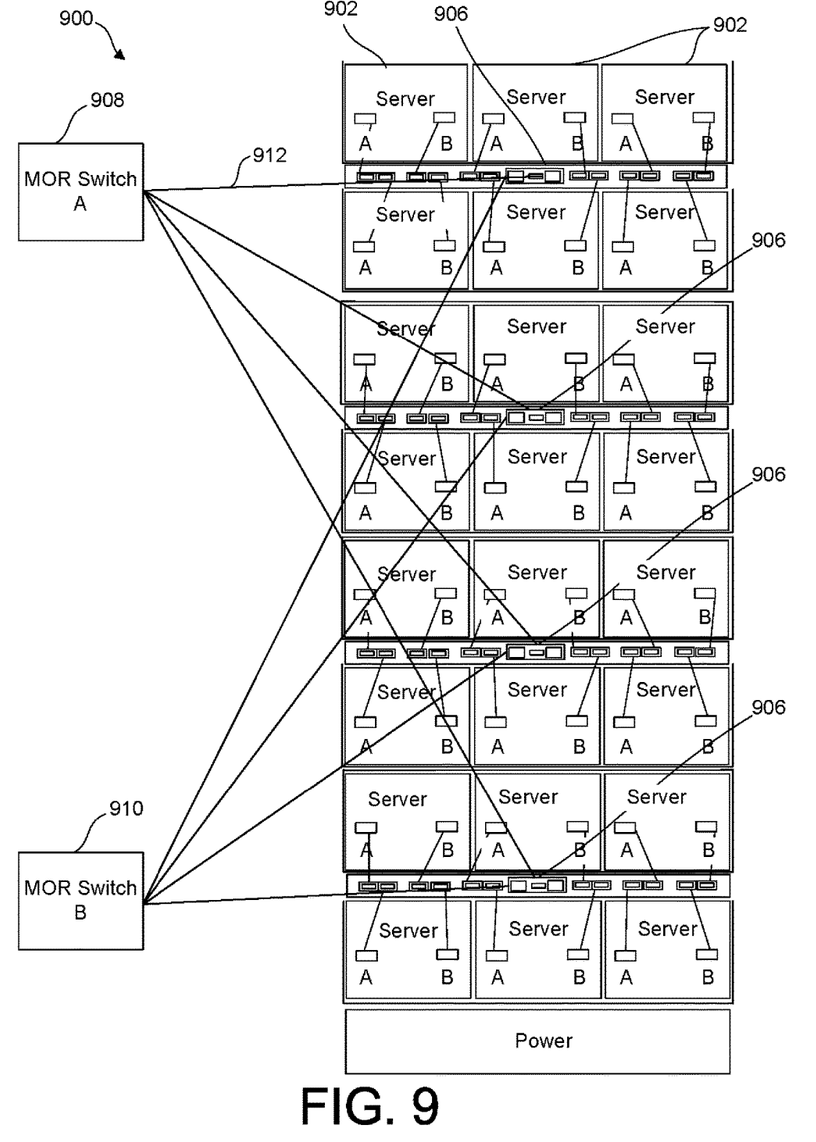
FIG. 9 illustrates an example physical connection for a partially-redundant rack-level schematic.

FIG. 9 illustrates an example horizontal rack-level stacked module physical implementation of the schematic shown in FIG. 8. In the example schematic 900, the server 902 A and B ports are connected to rack level optical modules 906 that are in communication with MOR switches A and B 908, 910 through an optical fiber communication medium 912. In this example configuration, MOR switches A and B 908, 910 are optically connected to all four rack level optical modules 906. The optical fiber communication medium 912 can be, for example, photonic cables with two separate cables with two separate connectors at module ends or alternatively a cable harness assembly with two switch ends and a single module end may be used. In this configuration all 24 channels of each optical module 906 are used with two channels routed to A ports and 2 channels routed to B ports for each of six servers 902.

Figure 10:
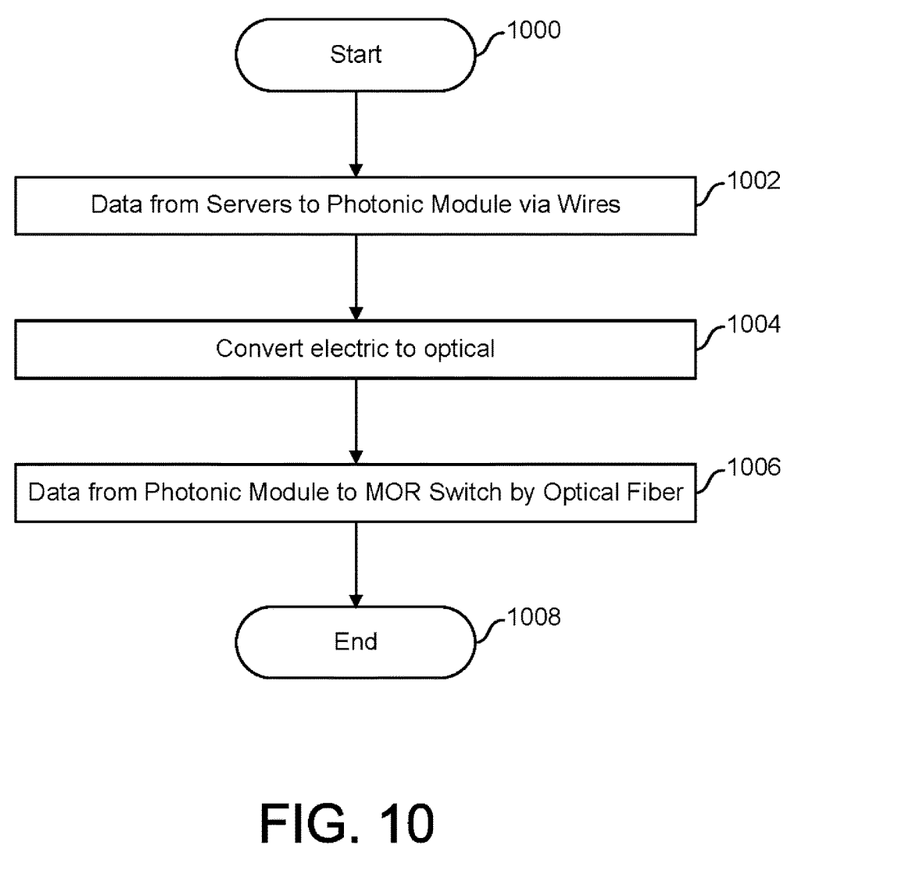
FIG. 10 illustrates an example method for communicating with a plurality of servers.

FIG. 10 illustrates an example method for communicating with a plurality of servers. The method begins at 1000 and continues to 1002 where data is communicated from a plurality of servers via wired connectors in communication with a rack level photonic module. The data is generally transmitted from the servers via network connectors that connect with copper network cables to communicate the data through the cable. The other end of the network cable is plugged into an optical or photonic module via a QSFP port, for example. At 1004 the optical module converts the wired data signals received from the servers into corresponding optical data signals. The optical data signals are communicated from the photonic module through an optical fiber to a switch external to the server rack at 1006. The switch may be a middle of row switch, for example. The network ports that received the wired signals are in communication with the optical module and receive signals therefrom. Further, the optical module is positioned at the rack level, i.e., mounted on the server rack or in the server rack next to the plurality of servers. The method ends at 1008.

In the preceding, reference is made to examples presented in this disclosure. However, the scope of the present disclosure is not limited to specific described examples. Instead, any combination of the following features and elements, whether related to different examples or not, is contemplated to implement and practice contemplated examples. Furthermore, although examples disclosed herein may achieve advantages over other possible solutions or over the prior art, whether or not a particular advantage is achieved by a given example is not limiting of the scope of the present disclosure. Thus, the preceding aspects, features, examples and advantages are merely illustrative and are not considered elements or limitations of the appended claims except where explicitly recited in a claim(s).

Examples presented in this disclosure are described above with reference to flowchart illustrations or block diagrams of methods, apparatus (systems) and computer program products according to examples disclosed herein. It will be understood that each block of the flowchart illustrations or block diagrams, and combinations of blocks in the flowchart illustrations or block diagrams, can be implemented by computer program instructions. These computer program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the flowchart or block diagram block or blocks.

While the foregoing is directed to examples presented in this disclosure, other and further examples or variations may be devised without departing from the basic scope of contemplated examples, and the scope thereof is determined by the claims that follow.

What is claimed is:

1. A server-to-switch interconnection system, comprising:
a plurality of server modules each having wired server network connection ports, the plurality of server modules being positioned in a server rack; and
a rack-level server photonic module mounted to a vertical support rail of the server rack or mounted horizontally in the server rack between rows of the plurality of server modules, the rack level server photonic module comprising:
a plurality of wired network connection ports connecting the rack-level server photonic module to a plurality of servers through wired connections each having a length that is less than a width of the server rack;
an optical transceiver in communication with the wired network connection ports; and
an optical port in optical communication with the optical transceiver and a first middle of row switch through a single optical cable.

2. The server-to-switch interconnection system of claim 1, further comprising a second middle of row switch in optical communication with the optical port.

3. The server-to-switch interconnection system of claim 2, wherein the first middle of row switch communicates with A ports on the plurality of server modules and the second middle of row switch communicates with B ports on the plurality of server modules.

4. The server-to-switch interconnection system of claim 1, further comprising the server rack having a plurality of rack level photonic modules, each of the plurality of rack level photonic modules being in optical communication with the first middle of row switch.

5. The server-to-switch interconnection system of claim 1, wherein the rack level photonic module further comprises an integrated power supply.

6. The server-to-switch interconnection system of claim 1, wherein the rack level photonic module further comprises an integrated cooling fan.

7. The server-to-switch interconnection system of claim 1, wherein the plurality of wired network connection ports, the optical transceiver, and the optical port are contained in a rack level housing.

8. The server-to-switch interconnection system of claim 1, wherein the optical transceiver comprises a 24 channel CWDM photonic module having 6 QSFP ports connecting through to the optical port.

9. The server-to-switch interconnection system of claim 1, wherein the single optical cable comprises a parallel fiber optical ribbon cable.

10. A rack level server photonic module, comprising:
a plurality of wired network communication ports; and
an optical transceiver module connected to the plurality of wired network communication ports and having an optical port, the optical transceiver module converting electrical signals from the plurality of wired network communication ports into optical signals for transmission to the optical port and converting optical signals from the optical port into electrical signals for transmission to the plurality of wired network communication ports,
the plurality or wired network communication ports and the optical transceiver module being mounted to a vertical support rail of a server rack or horizontally in the server rack between rows of servers with the plurality of wired network communication ports being in communication with the rows of servers and the optical port being in communication with a single optical fiber for communicating with a switch outside the server rack.

11. The rack level server photonic module of claim 10, wherein the optical transceiver module is hot swappable.

12. The rack level server photonic module of claim 10, wherein the switch outside the server rack is a middle of row switch.

13. The rack level server photonic module of claim 12, wherein the optical fiber comprises a parallel fiber optical ribbon cable.

14. The rack level server photonic module of claim 13, wherein the plurality of wired network communication ports comprise QSFP ports.

15. The rack level server photonic module of claim 10, wherein wired connections between the optical transceiver module and the wired network communication ports have a length that is less than a width of the server rack.

16. A method for communicating with a plurality of servers, comprising:
communicating data from a plurality of servers via wired connectors in communication with a rack level photonic module that is integrated into a vertical rail of a server rack or horizontally between rows of the plurality of servers;
converting wired data signals into corresponding optical data signals in the rack level photonic module; and
communicating the optical data signals from the rack level photonic module through a single optical cable to a switch external to a server rack containing the plurality of servers and the rack level photonic module.

17. The method of claim 16, wherein the wired connectors comprise QSFP ports connected to copper network cables and wherein the optical cable comprises a parallel optical ribbon cable.

\* \* \* \* \*